(12) United States Patent
Sheinman

(10) Patent No.: US 11,105,891 B2
(45) Date of Patent: Aug. 31, 2021

(54) MULTI-INPUT DOWNCONVERSION MIXER

(71) Applicant: SEMICONDUCTOR COMPONENTS INDUSTRIES, LLC, Phoenix, AZ (US)

(72) Inventor: Benny Sheinman, Haifa (IL)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 174 days.

(21) Appl. No.: 16/583,663

(22) Filed: Sep. 26, 2019

(65) Prior Publication Data

US 2020/0191903 A1     Jun. 18, 2020

Related U.S. Application Data

(60) Provisional application No. 62/779,293, filed on Dec. 13, 2018.

(51) Int. Cl.
*G01S 7/03* (2006.01)
*H01Q 1/32* (2006.01)
*H03D 7/12* (2006.01)
*H03D 7/14* (2006.01)
*G01S 7/02* (2006.01)
(Continued)

(52) U.S. Cl.
CPC ........... *G01S 7/036* (2013.01); *H01Q 1/3233* (2013.01); *H03D 7/125* (2013.01)

(58) Field of Classification Search
None
See application file for complete search history.

(56) References Cited

U.S. PATENT DOCUMENTS 3,665,507 A * 5/1972 Peil .......................... H04B 1/28
                                                                455/142
5,323,064 A * 6/1994 Bacon ....................... H04B 1/26
                                                                327/105

(Continued)

FOREIGN PATENT DOCUMENTS

EP          2573936 A1 *  3/2013  ........... H03D 7/1458

OTHER PUBLICATIONS

Danny Elad et al., "Reconfigurable MIMO Radar," U.S. Appl. No. 16/203,149, filed Nov. 28, 2018, 20 pages.

(Continued)

*Primary Examiner* — Bernarr E Gregory
(74) *Attorney, Agent, or Firm* — Ramey & Schwaller, LLP

(57) ABSTRACT

Multi-input downconversion mixers, systems, and methods are provided with input switching in the intermediate frequency or baseband domain. One illustrative mixer embodiment includes: multiple differential pairs of transistors and multiple pairs of switches. Each differential transistor pair has their bases or gates driven by a differential reference signal, their emitters or sources connected to a common node having a current or voltage driven based on a respective one of multiple receive signals, and their collectors or drains providing a product of the differential reference signal with the respective one of the multiple receive signals. Each of the switch pairs selectively couples differential output nodes to the collectors or drains of a respective one of the multiple differential pairs, enabling the differential output nodes to convey an output signal that is a sum of products from selected ones of the multiple differential pairs.

20 Claims, 5 Drawing Sheets

(51) Int. Cl.
*G01S 13/00* (2006.01)
*H03D 7/00* (2006.01)

(56) References Cited

U.S. PATENT DOCUMENTS

| | | | | | |
|---|---|---|---|---|---|
| 5,369,409 | A * | 11/1994 | Urabe | ............... | G01S 13/343 |
| | | | | | 342/133 |
| 5,448,244 | A * | 9/1995 | Komatsu | ............... | G01S 13/931 |
| | | | | | 342/155 |
| 5,486,832 | A * | 1/1996 | Hulderman | ............... | G01S 13/931 |
| | | | | | 342/175 |
| 5,949,365 | A * | 9/1999 | Wagner | ............... | G01S 13/931 |
| | | | | | 342/70 |
| 5,955,991 | A * | 9/1999 | Kawakubo | ............... | G01S 13/345 |
| | | | | | 342/374 |
| 6,292,129 | B1 * | 9/2001 | Matsugatani | ......... | G01S 13/345 |
| | | | | | 342/70 |
| 6,584,486 | B1 * | 6/2003 | Helfenstein | .......... | H03D 7/1458 |
| | | | | | 708/801 |
| 6,859,168 | B2 * | 2/2005 | Isaji | ............... | G01S 7/4021 |
| | | | | | 342/107 |
| 7,504,990 | B2 * | 3/2009 | Isaji | ............... | G01S 7/35 |
| | | | | | 342/107 |
| 7,688,255 | B2 * | 3/2010 | Suzuki | ............... | G01S 13/931 |
| | | | | | 342/133 |
| 7,830,198 | B2 * | 11/2010 | Liu | ............... | H03D 7/1458 |
| | | | | | 327/355 |
| 9,634,609 | B2 * | 4/2017 | Bryant | ............... | H03D 7/1458 |
| 2007/0052581 | A1 * | 3/2007 | Shima | ............... | G01S 7/4021 |
| | | | | | 342/173 |
| 2007/0170973 | A1 * | 7/2007 | Abdelli | ............... | H03D 7/1416 |
| | | | | | 327/359 |
| 2009/0267676 | A1 | 10/2009 | Liu et al. | | |
| 2010/0304703 | A1 * | 12/2010 | Han | ............... | H04B 1/28 |
| | | | | | 455/324 |
| 2011/0006941 | A1 * | 1/2011 | Samukawa | ............... | G01S 13/931 |
| | | | | | 342/70 |
| 2011/0121881 | A1 | 5/2011 | Feng et al. | | |

OTHER PUBLICATIONS

Yohsuke Takeda et al., "A 76- to 81-GHz Transceiver Chipset for Long-Range and Short-Range Automotive Radar," 2014 IEEE MTT-S International Microwave Symposium (IMS2014), 3 pages.

* cited by examiner

MULTI-INPUT DOWNCONVERSION MIXER

CROSS-REFERENCE TO RELATED APPLICATIONS

The present application claims priority to Provisional U.S. Application 62/779,293, filed 2018 Dec. 13 and titled "Multi-input down conversion mixer" by inventor Benny Sheinman. This provisional is hereby incorporated herein by reference in its entirety.

BACKGROUND

In the quest for ever-safer and more convenient transportation options, many car manufacturers are developing self-driving cars which require an impressive number and variety of sensors, often including arrays of acoustic and/or electromagnetic sensors to monitor the distance between the car and any nearby persons, pets, vehicles, or obstacles. Among the contemplated sensing technologies are multi-input, multi-output radar systems, though it can be cost-prohibitive to provide a sufficient number of transmitters and receivers for an adequately-performing antenna array. The prior art fails to offer a satisfactory solution to this dilemma.

For example, an automotive radar receiver is disclosed in Floyd et al., "A 76- to 81-GHz Transceiver Chipset for Long-Range and Short-Range Automotive Radar", 2014 IEEE MTT-S International Microwave Symposium (IMS2014), providing a standard one-to-one correspondence between antennas and transmitters. US Pat. App. Pub. 2009/0267676 "Multi-input mixer, mixer device, and mixing method" provides a multi-input mixer design that causes undesirable loading of the inputs and lacks adequate isolation between inputs. US Pat. App. Pub. 2011/0121881, "Multiple input/gain stage Gilbert cell mixers" provides a multi-input downconversion mixer design that requires differential inputs, enables only one input at a time (yet still causes undesirable loading of the inputs), and lacks adequate isolation between inputs.

SUMMARY

The shortcomings identified above may be addressed at least in part by multi-input downconversion mixers, systems, and methods with switching provided in the intermediate frequency or baseband domain. One illustrative mixer embodiment includes: multiple differential pairs of transistors and multiple pairs of switches. Each differential transistor pair has their bases or gates driven by a differential reference signal, their emitters or sources connected to a common node having a current or voltage driven based on a respective one of multiple receive signals, and their collectors or drains providing a product of the differential reference signal with the respective one of the multiple receive signals. Each of the switch pairs selectively couples differential output nodes to the collectors or drains of a respective one of the multiple differential pairs, enabling the differential output nodes to convey an output signal that is a sum of products from selected ones of the multiple differential pairs.

One illustrative mixing method embodiment includes: supplying a differential reference signal to the bases of each of multiple differential pairs of transistors, each of the multiple differential pairs having their emitters connected to a common node; driving a current from each of the common nodes based on a respective one of multiple receive signals to produce a product of that signal with the differential reference signal at the collectors of the corresponding one of the multiple differential pairs; and using multiple pairs of switches to couple the collectors of one or more selected differential pairs to a pair of differential output nodes to sum selected ones of said products.

One illustrative system embodiment is an automotive radar system including: a radar transmitter; a radar receiver; and a digital signal processor. The radar receiver has a multi-input downconversion mixer providing an output signal having switchable inclusion of product signals between a differential reference signal and each of multiple antenna receive signals. The digital signal processor couples to the radar receiver to process the receive signals, to detect reflections of a signal transmitted by the radar transmitter, and to derive signal measurements therefrom.

Each of the foregoing embodiments can be employed individually or in conjunction, and may include one or more of the following features in any suitable combination: (1) capacitors coupled to the differential output nodes to suppress high frequencies from the output signal, said high frequencies including those of the differential reference signal and the multiple receive signals. (2) load impedances to bias the differential output nodes. (3) multiple load impedances, each load impedance biasing the common node of a respective one of the differential pairs. (4) the multiple load impedances are each part of a corresponding voltage divider coupled between a reference voltage and the common node of a respective one of the multiple differential pairs, the respective one of the multiple receive signals driving an intermediate node of the corresponding voltage divider. (5) multiple input transistors each coupled between a reference voltage and the common node of a respective one of the multiple differential pairs, and each having a base or gate driven by a respective one of the multiple receive signals. (6) a differential antenna signal forms two of the multiple receive signals. (7) the multiple pairs of switches each comprise a pair of field effect transistors. (8) suppressing high frequencies from the output signal, said high frequencies including those of the differential reference signal and the multiple receive signals. (9) biasing the differential output nodes with load impedances. (10) biasing the common node of each of the differential pairs with respective load impedances.

It should be understood that the drawings and corresponding detailed description are provided for explanatory purposes, not to limit the disclosure. To the contrary, they provide the foundation for understanding all modifications, equivalents, and alternatives falling within the scope of the appended claims.

DETAILED DESCRIPTION

Figure 1:
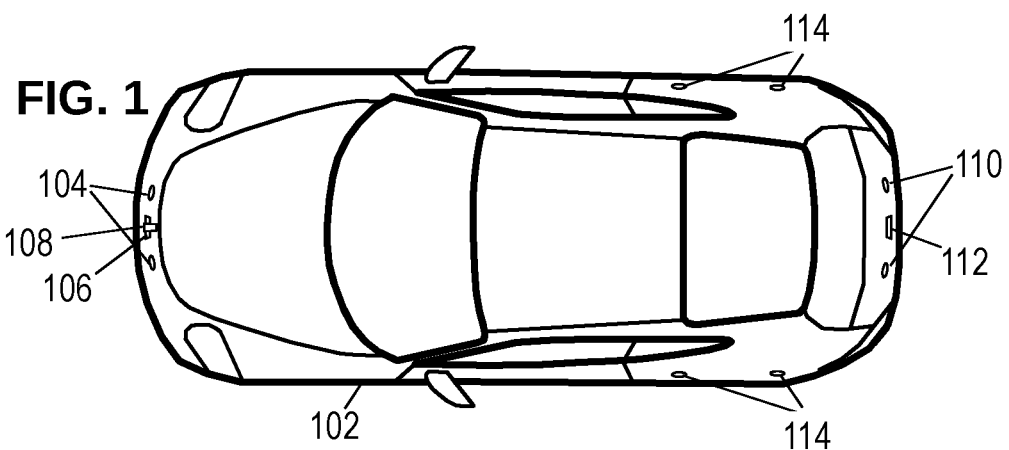
FIG. 1 is an overhead view of an illustrative vehicle equipped with sensors.

FIG. 1 shows an illustrative vehicle 102 equipped with an array of radar antennas, including antennas 104 for short range sensing (e.g., for park assist), antennas 106 for mid-range sensing (e.g., for monitoring stop & go traffic and cut-in events), antennas 108 for long range sensing (e.g., for adaptive cruise control and collision warning), each of which may be placed behind the front bumper cover. Antennas 110 for short range sensing (e.g., for back-up assist) and antennas 112 for mid range sensing (e.g., for rear collision warning) may be placed behind the back bumper cover. Antennas 114 for short range sensing (e.g., for blind spot monitoring and side obstacle detection) may be placed behind the car fenders. Each set of antennas may perform multiple-input multiple-output (MIMO) radar sensing. The type, number, and configuration of sensors in the sensor arrangement for vehicles having driver-assist and self-driving features varies. The vehicle may employ the sensor arrangement for detecting and measuring distances/directions to objects in the various detection zones to enable the vehicle to navigate while avoiding other vehicles and obstacles.

Figure 2:
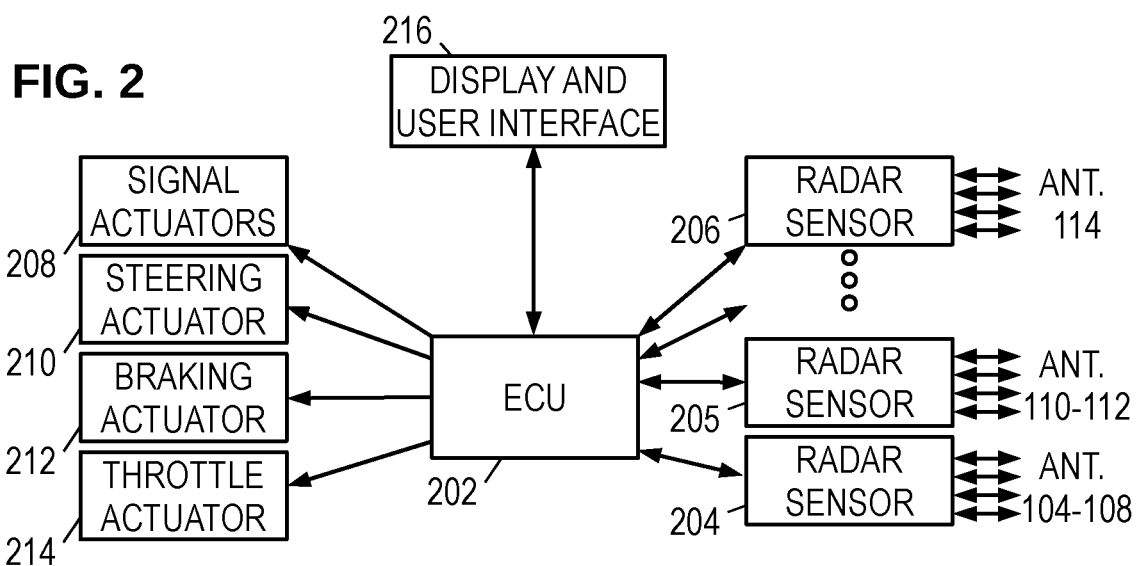
FIG. 2 is a block diagram of an illustrative driver-assistance system.

FIG. 2 shows an electronic control unit (ECU) 202 coupled to the various radar sensors 204-206 as the center of a star topology. Of course, other topologies including serial, parallel, and hierarchical (tree) topologies, are also suitable and contemplated for use in accordance with the principles disclosed herein. The radar sensors each include a radio frequency (RF) front end which couples to some of the transmit and receive antennas 104-114 to transmit electromagnetic waves, receive reflections, and determine a spatial relationship of the vehicle to its surroundings. To provide automated parking assistance, the ECU 202 may further connect to a set of actuators such as a turn-signal actuator 208, a steering actuator 210, a braking actuator 212, and throttle actuator 214. ECU 202 may further couple to a user-interactive interface 216 to accept user input and provide a display of the various measurements and system status.

Using the interface, sensors, and actuators, ECU 202 may provide automated parking, assisted parking, lane-change assistance, obstacle and blind-spot detection, autonomous driving, and other desirable features. In an automobile, the various sensor measurements are acquired by one or more electronic control units (ECU), and may be used by the ECU to determine the automobile's status. The ECU may further act on the status and incoming information to actuate various signaling and control transducers to adjust and maintain the automobile's operation. Among the operations that may be provided by the ECU are various driver-assist features including automatic parking, lane following, automatic braking, and self-driving.

To gather the necessary measurements, the ECU may employ a MIMO radar system. Radar systems operate by emitting electromagnetic waves which travel outward from the transmit antenna before being reflected back to a receive antenna. The reflector can be any moderately reflective object in the path of the emitted electromagnetic waves. By measuring the travel time of the electromagnetic waves from the transmit antenna to the reflector and back to the receive antenna, the radar system can determine the distance to the reflector. If multiple transmit or receive antennas are used, or if multiple measurements are made at different positions, the radar system can determine the direction to the reflector and hence track the location of the reflector relative to the vehicle. With more sophisticated processing, multiple reflectors can be tracked. At least some radar systems employ array processing to "scan" a directional beam of electromagnetic waves and construct an image of the vehicle's surroundings. Both pulsed and continuous-wave implementations of radar systems can be implemented, though frequency modulated continuous wave radar systems are generally preferred for accuracy.

Figure 3:
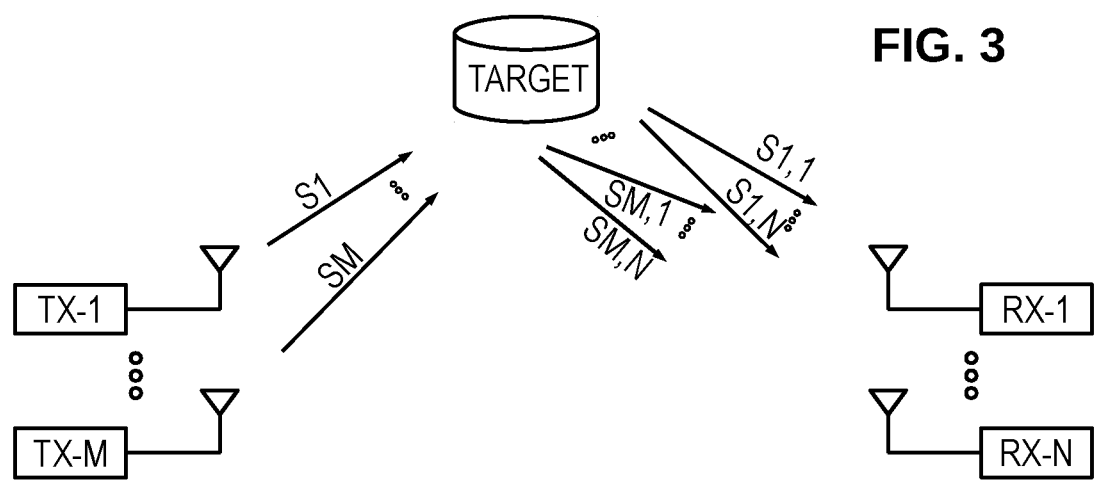
FIG. 3 is a schematic of an illustrative fixed multi-input, multi-output (MIMO) radar system.

FIG. 3 shows an illustrative system having a fixed MIMO configuration, in which M transmitters are coupled to M transmit antennas to concurrently send M transmit signals. The M signals may variously reflect from one or more targets to be received by N receive antennas coupled to N receivers. Each receiver may extract the amplitude and phase or travel delay associated with each of the M transmit signals, thereby enabling the system to concurrently obtain N*M measurements. Often the measurements need not be acquired concurrently. Further, the processing requirements associated with each receiver extracting M measurements can be reduced via the use of time division multiplexing and/or orthogonal coding. Regardless, fixed MIMO systems employ a respective antenna for each transmitter or receiver.

Figure 4:
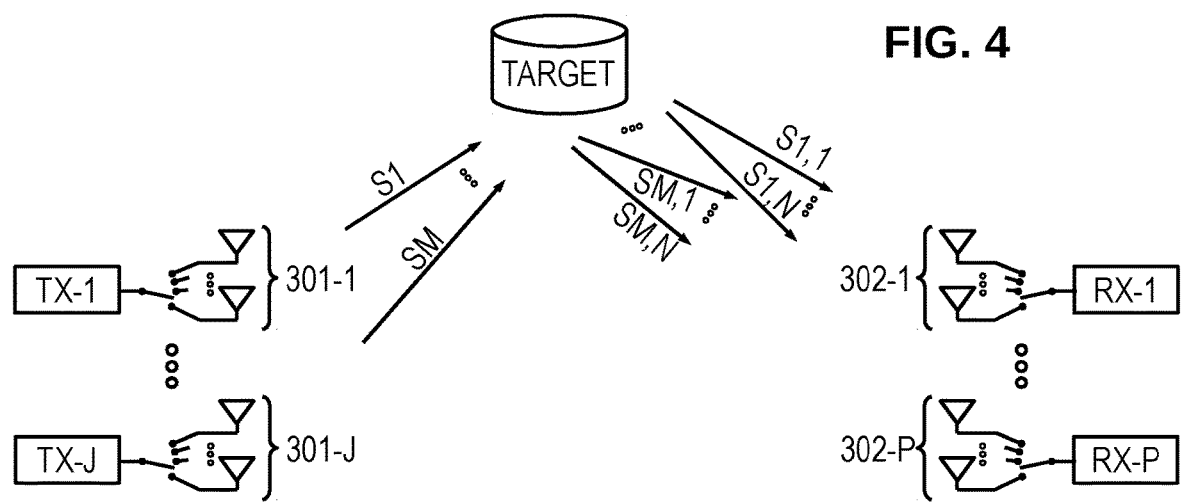
FIG. 4 is a schematic of an illustrative reconfigurable MIMO radar system.

However, the greater the number of antennas, the greater the diversity of the system (i.e., the greater the number of independent measurements that the system can acquire and use for image formation). Accordingly, FIG. 4 shows an illustrative reconfigurable MIMO radar system in which M transmit antennas can each be selectively coupled to one of J<M transmitters, and N receive antennas can each be selectively coupled to P<N receivers, enabling N*M measurements to be obtained by only J transmitters and P receivers, thereby maintaining measurement diversity of the system while significantly reducing the system's size and cost. Alternatively the number of transmitters and receivers may be maintained while increasing the number of antennas to significantly improve the performance of the system without substantially increasing the system's cost. (Radar switches and antennas can be made with less cost than radar transmitters and receivers.) The available antennas are systematically multiplexed to the available transmitters and receivers to collect the full set of measurements for radar imaging.

Figure 5:
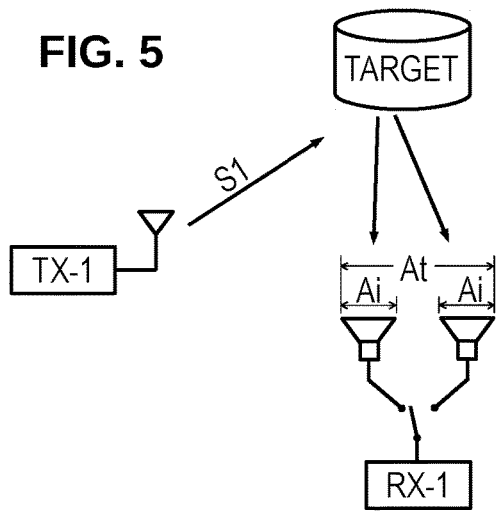
FIG. 5 is a schematic of one reconfigurable MIMO system application.

As shown in FIG. 5, the reconfigurable MIMO system can operate to improve the spatial resolution of radar and imaging systems while keeping the power consumption low. Each transmitter and receiver is sequentially connected to each of the available antennas, and the measurements are digitally combined for image formation having improved spatial resolution. The illustrated system includes a single transmitter with a single transmit antenna and a single receiver with two selectable receiving antennas. Selecting between the antennas is demonstrated using a switch. Other selection methods are possible as well.

By receiving the signal from the first antenna and then switching to the other antenna, the total aperture of the receiving system, $A_{tot}$, becomes larger than the aperture of the individual antenna, $A_{ind}$. Since image resolution is inversely proportional to the antenna aperture (large aperture generates narrow beam width), the resolution increases after suitable post processing. In contrast, a fixed MIMO system would require 2 receivers to be connected to the two receiving antennas in order to achieve the same resolution. Therefore, the reconfigurable MIMO approach provides increased resolution while keeping the power consumption low. In addition, since only a single receiver is used, the size of the chip that usually used to implement the receiver can be smaller and the system cost can be reduced.

Figure 6:
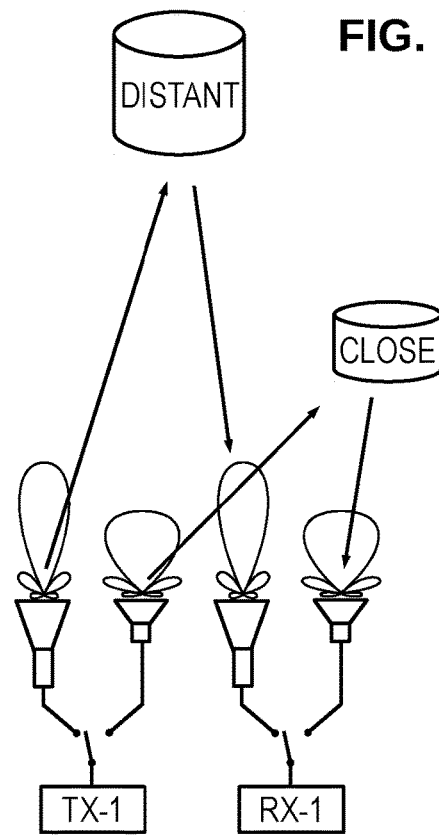
FIG. 6 is a schematic of a second reconfigurable MIMO system application.

As shown in FIG. 6, the reconfigurable MIMO system can operate to improve the range detection capabilities. To cover different detection ranges, the transmitters can be switched between transmit antennas having narrow and wide beam widths, and the receivers can be similarly switched between antennas having narrow and wide beam widths. The wide beam width antennas offer a wide field of view with better sensitivity to nearby targets but lack the range to detect distant targets. Conversely, narrow bandwidth antennas offer greater range for detecting distant targets but with their narrow field of view they may fail to detect nearby targets outside the narrow beam. The reconfigurable MIMO system may switch between the antennas systematically or as needed, thereby obtaining improved range detection capabilities beyond what would otherwise be currently feasible.

The illustrated system includes a single transmitter with two different transmitting antennas and a single receiver with two different receiving antennas. Selecting between the antennas is demonstrated using a switch. Other selection methods are possible as well. A selection method using a multi-input downconversion mixer is described below. For detection of distant targets (Long Range Radar, useful when traveling at high speed) a high gain and narrow beam width antenna is chosen. For detection of close targets (Short Range Radar, useful when traveling slowly through a crowded environment) a low gain and wide beam width antenna is chosen. A fixed MIMO solution requires 2 transmitters and 2 receivers to achieve the same dual-range capabilities. Therefore, the reconfigurable MIMO approach improves the imaging radar range capabilities while reducing the number of transmitters and receivers.

Figure 7A:
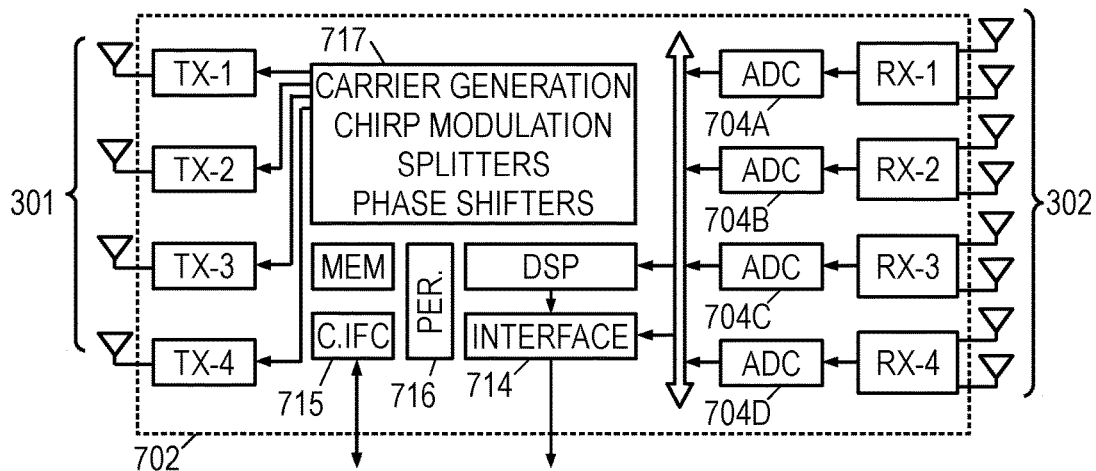
FIG. 7A is a block diagram of an illustrative MIMO radar transceiver chip.

FIG. 7A shows a block diagram of an illustrative RF front end chip 702 having transceivers configured for a reconfigurable MIMO system. It includes 4 receivers (RX-1 through RX-4) each of which is selectably coupled to two receive antennas 302, providing a reconfigurable MIMO system with 8 receive antennas, four of which can be employed concurrently to collect measurements. Four ADCs 704A-704D sample and digitize the baseband receive signals from the receivers RX-1 through RX-4, supplying the digitized signals to a digital signal processor (DSP) for filtering and processing, or directly to a high-bandwidth interface 714 to enable off-chip processing of the digitized baseband signals. If used, the DSP generates image data that can be conveyed to an ECU via the high-bandwidth interface 714.

A control interface 715 enables the ECU or other host processor to configure the operation of the RF front end chip 702, including the test and calibration peripheral circuits 716 and the transmit signal generation circuitry 717. Circuitry 717 generates a carrier signal within a programmable frequency band, with a programmable chirp rate and range. Splitters and phase shifters enable the multiple transmitters TX-1 through TX-4 to operate concurrently if desired. In the illustrated example, the RF front end chip 702 includes 4 transmitters (TX-1 through TX-4) each of which is fixedly coupled to a corresponding transmit antenna 301. In alternative embodiments, multiple transmit antennas are selectably coupled to each of the transmitters.

A potential disadvantage of employing a reconfigurable MIMO system with multiple receive antennas is the time required to repeat measurements with different combinations of transmit and receive antennas. In certain contemplated embodiments, the time required may be minimized by performing antenna switching during ongoing signal transmission. For example, while a transmitter is sending a transmit signal from a selected antenna, each receiver may acquire a first measurement with a first selected antenna and then, while the pulse transmission continues, switch to a second selected antenna to collect a second measurement. Additionally, or alternatively, while the transmitter is sending a transmit pulse via a first selected antenna, the transmitter may switch to a second selected antenna, enabling each receiver to obtain measurements responsive to the use of each transmit antenna.

Figure 7B:
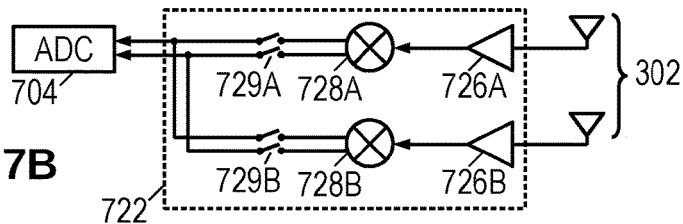
FIG. 7B is a schematic of an illustrative configuration for an antenna-switching receiver.

FIG. 7B shows an illustrative embodiment of a receiver RX-n in the form of a multi-input downconversion mixer 722 that couples a selectable one or more of the multiple receiver antennas 302 to an analog-to-digital converter (ADC) 704. The mixer 722 includes a separate connection terminal for each receive antenna 302. Each of the terminals is optionally coupled to a low noise amplifier (LNA) 726A, 726B. The LNAs 726 amplify the receive signal from the corresponding antenna to improve the received signal strength, but are not essential. The output of each LNA 726A, 726B is coupled to a corresponding signal multiplier 728A, 728B, which multiplies the amplified receive signal with a reference signal to downconvert the amplified receive signal to an intermediate frequency or baseband, in differential form. The reference signal may be, e.g., a carrier signal, a frequency-modulated carrier signal, or a buffered version of the transmit signal. An arrangement of switches 729A, 729B selectably couple the differential baseband or intermediate frequency signals to the mixer's output terminals. ADC 704 digitizes the baseband signal for further digital signal processing, which determines distance and direction information for the reflectors producing the receive signal. Filters may be provided within the signal multipliers 728, within the ADC 704, or in an intermediate position, to block harmonics from the downconversion process.

Switches 729 may be, e.g., a mechanical switch or a switch implemented using transistors that convey baseband or intermediate frequency signals with minimal attenuation or distortion. Because the spectrum of these signals excludes high frequency content, a traditional transistor-based switch or multiplexer can be employed. Metal oxide semiconductor field effect transistors are suitable for implementing such switches.

Figure 8A:
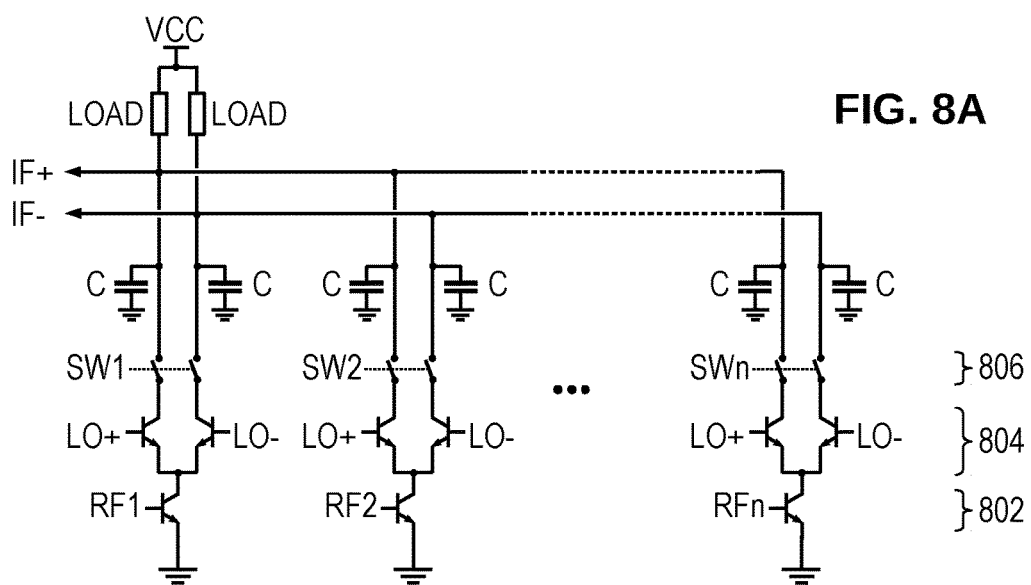
FIGS. 8A-8E are illustrative circuit embodiments of a multi-input downconversion mixer.

FIG. 8A shows an illustrative circuit implementation of a multi-input downconversion mixer 722. Each of multiple inputs RF1, RF2, . . . RFn, is coupled to the base or gate of a respective input transistor 802. The input transistors 802 are each coupled between ground (or another reference voltage) and the common node of a differential pair of transistors 804. A differential pair, also known as a "long tail" pair, is formed by two transistors having their emitters or sources connected to a common node to "compete" for current flow from the node, thereby producing amplification of the difference between signals applied to their bases or gates, shown in FIG. 8A as LO+ and LO−, representing a differential carrier signal from a local oscillator. The transistors may be bipolar junction transistors (BJTs) or metal oxide semiconductor field effect transistors (MOSFETs). The amplified difference appears between the collectors or drains of the two transistors. Because the current flow from the common node is modulated by the input transistor, the signal between the collectors or drains of each differential pair 804 is the product of the respective input signal and the differential carrier signal.

A set of double pole single throw (DPST) switches 806 connect or disconnect the collectors or drains of differential pairs 804 to "intermediate frequency" output terminals IF+ and IF−, so that the output terminals convey the sum of the product signals from the connected differential pairs 804. (Often, only one of the differential pairs will be connected, providing a mechanism for switching between inputs.) Switches 806 may be mechanical or transistor-based. A load impedance LOAD may be provided to pull-up or otherwise bias the output terminals along with any connected differential pairs 804. In some contemplated embodiments, the load impedance is replaced by an active load composed of active devices. Capacitances are preferably coupled to each output terminal, and may cooperate with the load impedances to filter high frequencies from the output signal. In particular, the capacitances may be sized to provide a cutoff frequency that suppresses the frequencies of the differential reference signal and the antenna input signals, enabling only the intermediate and/or baseband frequencies of the product signals to reach the output terminals. In FIG. 8A, these capacitances are implemented as discrete capacitors C each coupled to one of the terminals of switches 806—a configuration which may improve isolation between the input signals. Isolation may be further improved by disabling the reference input signal LO+, LO− for any disconnected differential pairs. In any case, because the summing of signals occurs in the intermediate frequency domain rather than the radio frequency domain, the input signals are not unnecessarily loaded.

Though the reference input signal terminals are marked as "local oscillator" terminals and the output signal terminals are marked as "intermediate frequency" terminals, the reference input signal is not limited to just a carrier signal, and the output signal need not be an intermediate frequency signal. As previously mentioned, the reference input signal may be a modulated signal or a buffered version of the transmit signal, and the output signal may optionally be a baseband signal.

Figure 8B:
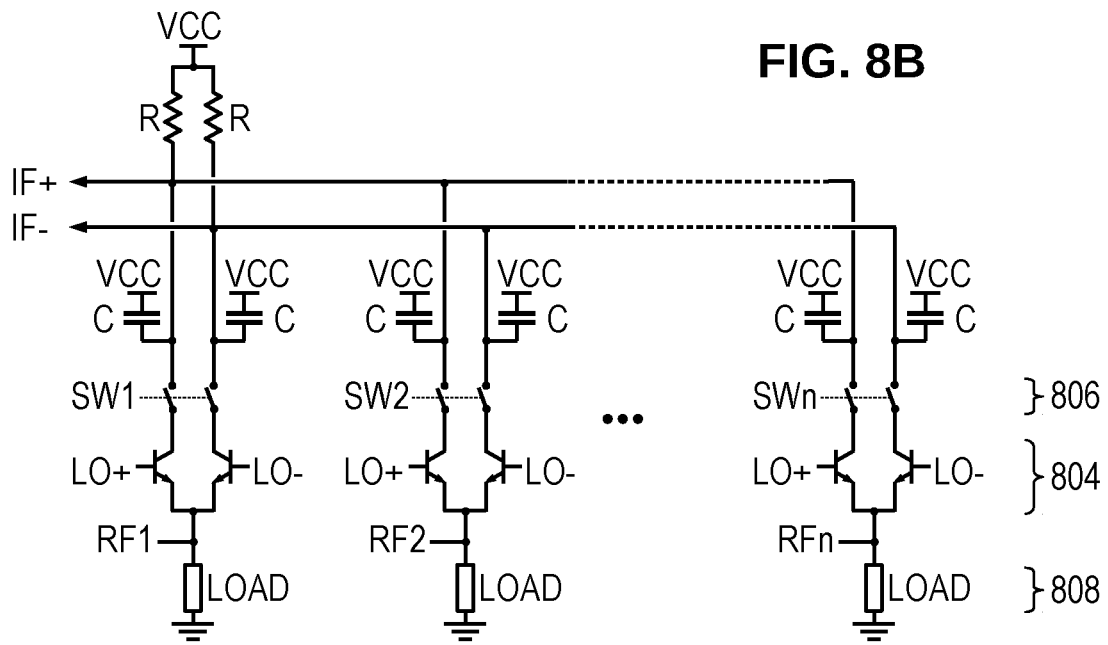

FIG. 8B shows another illustrative circuit implementation of mixer 722. In this implementation, the input transistors 802 are replaced with load impedances 808, and the input signals RF1-RFn directly drive the common node of the differential pairs 804. Load impedances 808 may be current sources or high value resistors. The implementation of FIG. 8B expressly shows the pull-up impedances as resistors R, and the capacitors C are shown coupled to VCC rather than ground.

Figure 8C:
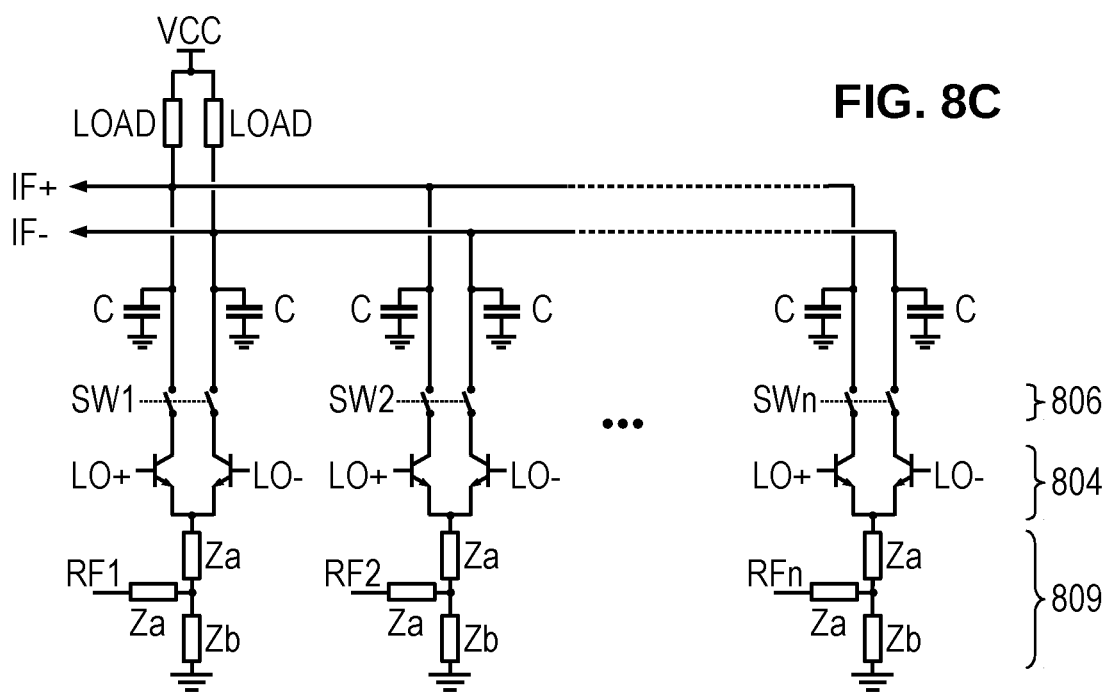

FIG. 8C shows yet another illustrative circuit implementation of mixer 722. In this implementation, the input transistors 802 are replaced by a matching network 809 that may provide power or noise matching at the relevant RF frequencies. In the figure, the matching network couples the common nodes of the differential pairs to ground via two impedances Za, Zb in series, and couples a respective one of the input signals RF1-RFn via a third impedance Za to the intermediate node between the first two impedances Za, Zb. This configuration is expected to provide improved linearity relative to the configuration of FIG. 8B.

Figure 8D:
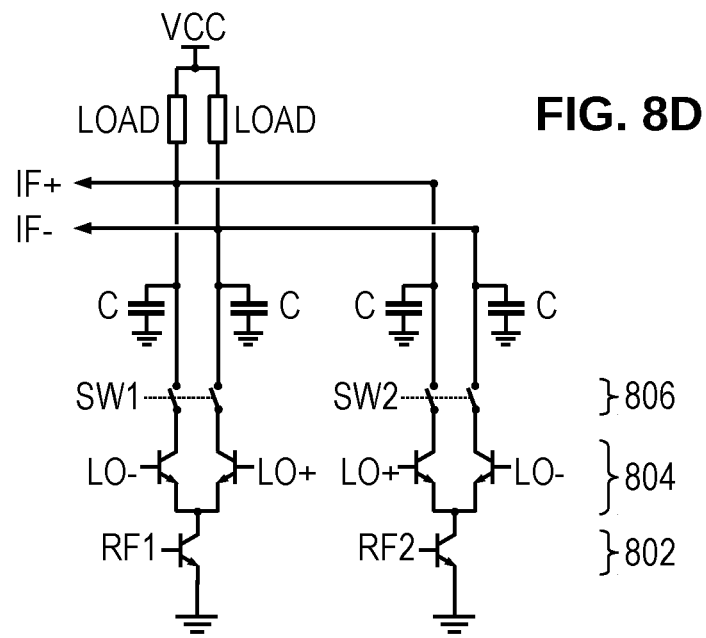

As mentioned above, the signal on the output terminals is a selected one of the product signals (or the sum of selected product signals) as determined by which of the differential amplifiers is/are connected. If it is desired to subtract one of the input signals, say RF1, from the rest, then its polarity can be reversed. Alternatively, as shown in FIG. 8D, the reference signal inputs LO+ and LO− can be swapped. This enables the mixer to selectively downconvert: (1) −RF1; (2) +RF2; and (3) RF2−RF1. This differential input option may be useful for a differential antenna input or an antenna input that has been converted to differential form by a balun or other means. In any case, the mixer's ability to handle single-ended and differential inputs increases flexibility. The required chip area for the circuit of FIG. 8D is essentially the same as that of a standard double-balanced mixer, with half the power consumption of the reference signal LO, improved noise performance, switchability between inputs in the intermediate frequency domain, and improved isolation between inputs.

Figure 8E:
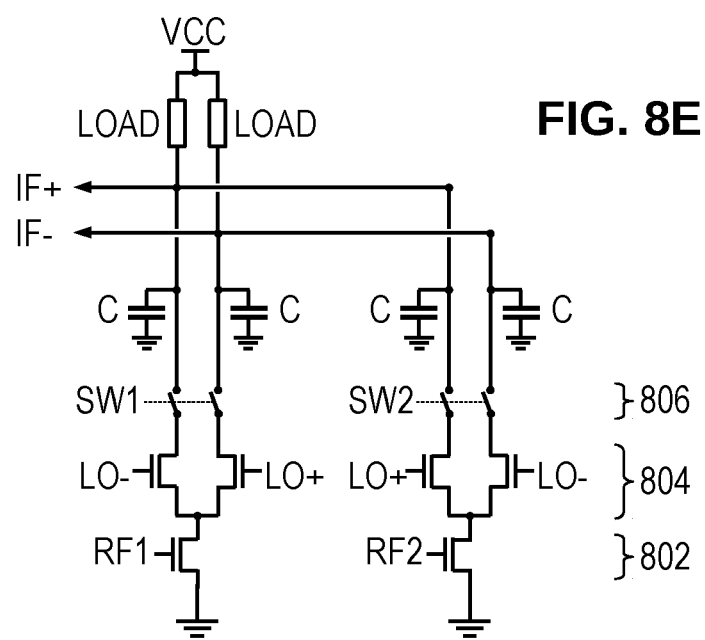

FIGS. 8A-8D have been drawn using the bipolar NPN symbol for each of the transistors, but it should be recognized that other transistor implementations are contemplated for use. By way of example, FIG. 8E shows the embodiment of FIG. 8D revised to use N-channel MOSFETs for each of the transistors. The circuits can also be readily adapted to employ bipolar PNPs, P-channel MOSFETs, CMOS, and other known transistor implementations.

The proposed reconfigurable MIMO system approach connects several antennas to each transmitter or receiver using, e.g., a switch. The various new transmit-receive antenna combinations created by using the additional antennas can, with suitable digital processing, improve the performance of imaging radar systems. Among other things, better spatial resolution, better range detection capabilities, and better power consumption can be achieved compared to existing radar solutions, and the principles disclosed herein may also be applicable to wireless communication systems (e.g., 5G). In the case of communications, the main purpose of the reconfigurable MIMO is to improve the communication capacity in multipath environments. In the case of radar systems, the reconfigurable MIMO approach can also provide improved performance in multipath environments, but perhaps more importantly it can improve angular resolution, multi-target tracking, and potentially provide multiple modes for increasing the detection range. More generally, the foregoing principles can be applied to any MIMO transducer array needing mixers to downconvert from radio frequencies (in especially radar or microwave frequencies) to intermediate or baseband. These and numerous other modifications, equivalents, and alternatives, will become apparent to those skilled in the art once the above disclosure is fully appreciated. It is intended that the following claims be interpreted to embrace all such modifications, equivalents, and alternatives where applicable.

What is claimed is:

1. A multi-input downconversion mixer that comprises:
   multiple differential pairs of transistors, each pair having their bases or gates driven by a differential reference signal, having their emitters or sources connected to a common node having a current or voltage driven based on a respective one of multiple receive signals, and having their collectors or drains providing a product of the differential reference signal with the respective one of the multiple receive signals; and
   multiple pairs of switches, each pair selectively coupling differential output nodes to the collectors or drains of a respective one of the multiple differential pairs, the differential output nodes conveying an output signal that is a sum of products from selected ones of the multiple differential pairs.

2. The mixer of claim 1, further comprising: capacitors coupled to the differential output nodes to suppress high frequencies from the output signal, said high frequencies including those of the differential reference signal and the multiple receive signals.

3. The mixer of claim 1, further comprising: load impedances to bias the differential output nodes.

4. The mixer of claim 1, further comprising: multiple load impedances, each load impedance biasing the common node of a respective one of the differential pairs.

5. The mixer of claim 4, wherein the multiple load impedances are each part of a corresponding voltage divider coupled between a reference voltage and the common node of a respective one of the multiple differential pairs, the respective one of the multiple receive signals driving an intermediate node of the corresponding voltage divider.

6. The mixer of claim 1, further comprising: multiple input transistors each coupled between a reference voltage and the common node of a respective one of the multiple differential pairs, and each having a base or gate driven by a respective one of the multiple receive signals.

7. The mixer of claim 1, wherein a differential antenna signal forms two of the multiple receive signals.

8. The mixer of claim 1, wherein the multiple pairs of switches each comprise a pair of field effect transistors.

9. A multi-input downconversion method that comprises:
supplying a differential reference signal to the bases of each of multiple differential pairs of transistors, each of the multiple differential pairs having their emitters connected to a common node;
driving a current from each of the common nodes based on a respective one of multiple receive signals to produce a product of that signal with the differential reference signal at the collectors of the corresponding one of the multiple differential pairs; and
using multiple pairs of switches to couple the collectors of one or more selected differential pairs to a pair of differential output nodes to sum selected ones of said products.

10. The method of claim 9, further comprising: suppressing high frequencies from the output signal, said high frequencies including those of the differential reference signal and the multiple receive signals.

11. The method of claim 9, further comprising: biasing the differential output nodes with load impedances.

12. The method of claim 9, further comprising: biasing the common node of each of the differential pairs with respective load impedances.

13. The method of claim 9, wherein said driving employs voltage dividers coupled between a reference voltage and the common nodes of the multiple differential pairs.

14. The method of claim 9, wherein said driving employs input transistors each coupled between a reference voltage and the common node of a respective one of the multiple differential pairs, and each having a base or gate driven by a respective one of the multiple receive signals.

15. The method of claim 9, wherein a differential antenna signal forms two of the multiple receive signals.

16. The method of claim 9, wherein the multiple pairs of switches each comprise a pair of field effect transistors.

17. An automotive radar system that comprises:
a radar transmitter;
a radar receiver having a multi-input downconversion mixer providing an output signal having switchable inclusion of product signals between a differential reference signal and each of multiple antenna receive signals; and
a digital signal processor coupled to the radar receiver to process the receive signals, to detect reflections of a signal transmitted by the radar transmitter, and to derive signal measurements therefrom.

18. The system of claim 17, wherein the multi-input downconversion mixer includes:
multiple differential pairs of transistors, each pair having their bases or gates driven by the differential reference signal, having their emitters or sources connected to a common node having a current or voltage driven based on a respective one of said receive signals, and having their collectors or drains providing one of said product signals; and
multiple pairs of switches, each pair selectively coupling differential output nodes to the collectors or drains of a respective one of the multiple differential pairs, the differential output nodes conveying the output signal as a sum of selected ones of said product signals.

19. The system of claim 18, wherein the mixer further includes: multiple input transistors each coupled between a reference voltage and the common node of a respective one of the multiple differential pairs, and each having a base or gate driven by a respective one of the receive signals.

20. The system of claim 18, wherein a differential antenna signal forms two of the multiple antenna receive signals.

* * * * *